United States Patent [19]

Davies et al.

[11] Patent Number: 5,008,736
[45] Date of Patent: Apr. 16, 1991

[54] THERMAL PROTECTION METHOD FOR A POWER DEVICE

[75] Inventors: Robert B. Davies, Robert B. Jarrett; both of Tempe, Ariz.

[73] Assignee: Motorola, Inc., Schaumburg, Ill.

[21] Appl. No.: 438,382

[22] Filed: Nov. 20, 1989

[51] Int. Cl.$^5$ .............................................. H01L 23/36
[52] U.S. Cl. ........................................ 357/75; 357/28; 357/81
[58] Field of Search .................. 357/75, 87, 28, 81, 357/67; 372/36; 361/388; 307/315, 310

[56] References Cited

U.S. PATENT DOCUMENTS

| 3,872,418 | 3/1975 | Plough et al. | 357/28 |
|---|---|---|---|
| 4,142,115 | 2/1979 | Nakata et al. | 357/28 |
| 4,383,270 | 5/1983 | Schelhorn | 357/81 |
| 4,571,728 | 2/1986 | Yoshikawa | 357/87 |
| 4,600,600 | 7/1986 | Pammer et al. | 357/67 |
| 4,604,753 | 8/1986 | Sawai | 372/36 |
| 4,673,772 | 6/1987 | Satoh et al. | 357/67 |
| 4,689,659 | 8/1987 | Watanabe | 357/87 |
| 4,742,023 | 5/1988 | Hasegawa | 357/67 |
| 4,854,731 | 8/1989 | Jenkins | 307/310 |
| 4,937,646 | 6/1990 | Tihanyi et al. | 307/310 |

FOREIGN PATENT DOCUMENTS

| 58-137239 | 8/1983 | Japan | 357/87 |
|---|---|---|---|
| 0253842 | 11/1986 | Japan | 357/87 |
| 62-21249 | 1/1987 | Japan | 357/81 |
| 62-150837 | 7/1987 | Japan | 357/81 |
| 63-52445 | 3/1988 | Japan | 357/81 |
| 63-293931 | 11/1988 | Japan | 357/81 |

OTHER PUBLICATIONS

Goodenough–"Power DMOS FET Gets Hot–Up to 150° C. and Turns Off Fast"–Electronics Design; Oct. 15, 1987, p. 57.
Chase et al., "Semiconductor Solder Reflow Chip Subvstrate Joining" IBM Tech. Disclosure, vol. 16, No. 8, 1–1974, p. 2675.

Primary Examiner—Rolf Hille
Assistant Examiner—S. V. Clark
Attorney, Agent, or Firm—Joe E. Barbee; Stuart T. Langley

[57] ABSTRACT

A thermally protected power transistor comprising a first chip which includes a power transistor and a second chip which includes protection circuitry. The second chip has a plurality of metallic bumps formed thereon which are coupled to various portions of the protection circuitry, wherein at least one metallic bump serves as a thermal couple. The protection circuitry chip is mounted upside down on the power transistor chip and coupled to the power transistor chip by the metallic bumps. The metallic bumps serve to provide electrical power for the protection circuitry, to couple control signals between the protection circuitry and the power transistor, and to couple thermal information from the power transistor to the protection circuitry.

11 Claims, 3 Drawing Sheets

THERMAL PROTECTION METHOD FOR A POWER DEVICE

BACKGROUND OF THE INVENTION

The present invention relates, in general, to temperature control circuits for integrated circuits, and more particularly, to temperature control circuits for power transistors.

Power transistors, including bipolar and MOSFET transistors, are well known. Power transistors are used to control high currents delivered to a load. Both bipolar and MOSFET power transistors have control electrodes, base or gate, which control current flowing through the transistor and allow it to be switched on and off. Power transistors are different from typical integrated circuits in that they operate at high temperature, typically 100 to 175° C., and must dissipate a large amount of heat through the package in which they are encapsulated.

Although the processes involved in making a power transistor and making typical integrated circuits are similar, they are not usually compatible. Attempts have been made to integrate control functions with a power transistor, but these attempts have not met with commercial success. This is because the additional cost involved in meshing both a standard integrated circuit process and a power transistor process make the resulting combination cost more than either of the devices alone. Also, combining two disparate processes compromises performance of both the integrated circuit and the power transistor. Because of this, many users have found it necessary to add control circuitry external to the power transistor to perform functions such as current limiting and temperature limiting.

Integrated circuit performance is usually limited to a specific operating temperature range. Power transistors in particular, because they already operate at high temperature, are particularly sensitive to an upper operating temperature limit. When a power transistor is forced to perform above its operating temperature limit, even in a transient mode, the device is often destroyed. Because of this, it has long been desired to be able to shut off a power transistor when a predetermined temperature or current limit has been reached to protect the device from destruction. As set out hereinbefore, however, it has been difficult to integrate such protection circuitry onto the same chip as the power transistor.

Effectiveness of a protective circuit is largely a function of how quickly it responds to a condition which has endangered the power device. A protection circuit must respond quickly, while at the same time not acting so quickly that spurious turn off results. Thus, just making the protective circuit more sensitive is not usually an acceptable means of improving response time because this will lead to false triggering of the protection circuit. What is needed is a method of quickly generating a signal which is proportional to the magnitude of the condition which endangers the power device.

Generating a temperature protection signal in particular has been difficult. Two aspects of thermal protection are important: first, the protection circuitry must be heated before response occurs, and second, the protection circuitry must be coupled to the power transistor by a low thermal impedance coupling. To speed response time, the thermal mass of the protection device must be minimized and the protection device must be located very close to the source of heat in the power transistor. If the protection circuitry is located in a different package from the power device, the only thermal coupling between the power device and the protection circuitry would be if the two devices shared a common heatsink. This thermal coupling is very slow and is effective only in very crude circuits. Another method is to mount the protection circuitry and the power transistor side-by-side in the same package which greatly reduces the physical space between the two circuits. This method, however, shares the same difficulty as the common heatsink method in that the time required for the thermal information to transfer from the power chip to the protection circuitry is longer than the time required to destroy the power transistor. So while these methods are effective for steady-state temperature protection, they are ineffective for transient thermal protection.

Surprisingly, even when the protection circuitry is formed on the same chip with the power transistor, the time delay between an over temperature condition and the protection circuitry responding to the over temperature condition can be too long. This is because the thermal mass of the entire power/protection chip must be heated to generate a response signal. Often, portions of the power device are heated to destructive temperatures before the entire mass is hot enough to trigger the protection circuitry. Until now, it has been very difficult to effectively protect a power transistor from transient thermal conditions.

Another method of coupling a protection circuit to a power transistor has been to mount the protection circuitry on top of the power transistor using a conductive paste to attach the back side of a protection circuit to the front side of a power transistor. This method further reduces the physical space between the protection circuitry and the power transistor, and allows the protection circuitry to approach the power transistor temperature relatively quickly. However, this method still suffers from the fact that heat transfer in silicon is relatively slow and that the entire mass of the power transistor and the protection circuitry had to rise in temperature before a shut off signal could be generated. Thus, even when the protection circuitry was mounted directly on the power transistor in this fashion the time delay between the transient and thermal condition and response of the protection circuitry was too long to protect the power transistor.

Accordingly, it is an object of the present invention to provide a power transistor with effective thermal protection.

Another object of the present invention is to provide a thermally protected power transistor with a faster response time to a thermal condition.

Another object of the present invention is to provide a thermally protected power transistor which is cost effective.

Another object of the present invention is to provide a thermally protected power transistor using conventional semiconductor processing techniques.

A further object of the present invention is to provide a thermally protected power transistor with improved response to transient thermal conditions.

SUMMARY OF THE INVENTION

These and other objects and advantages of the present invention are achieved by providing a thermally protected power transistor comprising a first chip which comprises a power transistor and a second chip which comprises protection circuitry. The second chip has a plurality of metallic bumps formed thereon which are coupled to various portions of the protection circuitry, wherein at least one metallic bump serves as a thermal monitor. The protection circuitry chip is mounted upside down on the power transistor chip and coupled to the power transistor chip by the metallic bumps. The metallic bumps serve to provide electrical power for the protection circuitry, to couple control signals between the protection circuitry and the power transistor, and to couple thermal information from the power transistor to the protection circuitry.

DETAILED DESCRIPTION OF THE DRAWINGS

Figure 1:
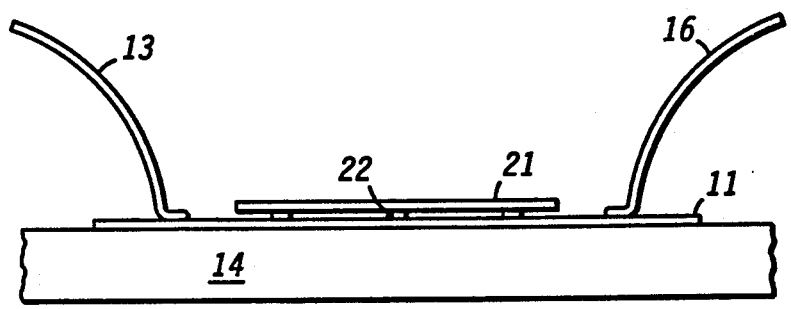
FIG. 1 is a highly simplified cross sectional view of the temperature control switch of the present invention.

FIG. 1 illustrates a highly simplified view of the thermally limited switch of the present invention. A semiconductor switching chip 11 is mounted to heatspreader 14. Heatspreader 14 may be a ceramic substrate, a metal lead frame, or similar package component. Power switching chip 11 is preferably a power MOSFET transistor, but may also be a power bipolar, thyristor, or the like. When power switching chip 11 is a three terminal device, for example a bipolar or MOSFET transistor, usually two wire bonds are made to a top surface of power switching chip 11, and a third electrical contact is made to a bottom surface of chip 11. In FIG. 1, wire 13 is a gate wire for a power MOSFET transistor and wire 16 is source wire while a drain contact is made through substrate 14 to the backside, or bottom side of power switching chip 11. A control chip 21 is mounted upside down on the top surface of power switching chip 11. A plurality of contact bumps 22 which are formed on a top surface of control chip 21, thermally, electrically, and mechanically couple control chip 21 to power switching chip 11. Conveniently, control chip 21 is smaller than power switching chip 11 so that when control chip 21 is mounted on chip 11 there is room left over for wire bonds 16 and 13.

Figure 2:
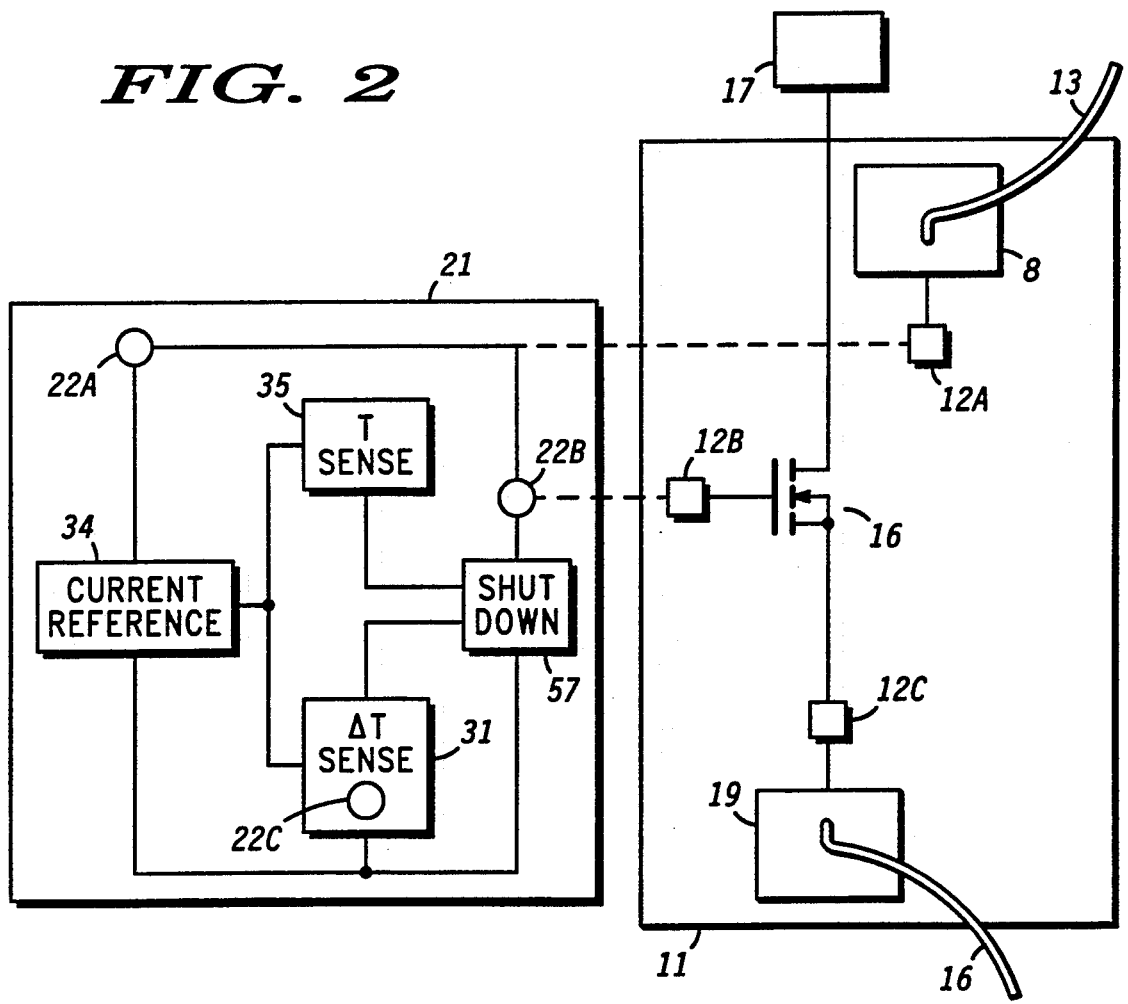
FIG. 2 illustrates a simplified block diagram and chip layout for the thermally limited switch of the present invention.

FIG. 2 illustrates a highly simplified layout and block diagram for control chip 21 and power switching transistor 11. For ease of description, a block diagram of each of the circuits is illustrated in FIG. 2 and the layout is arranged to give a general feel for how control chip 21 would be placed on top of power switching chip 11, but it should be noted that actual component position and specific layout of a chip will be highly variable and can be adapted to meet many specific manufacturing or performance goals of a manufacturer. Also, the thermal control circuit of the present invention may be combined with a variety of other logic or protections functions such as current limiting.

Power switching chip 11 is illustrated as a power MOSFET, or vertical DMOS structure having drain, gate, and source regions. Power MOSFET transistors are well-known and a variety of processes can be used to manufacture the device. Power switching transistor 11 is substantially a conventional off-the-shelf switching transistor, except for contact pads 12a–c which serve to couple power switching transistor 11 with control chip 21. Source bond pad 19 is coupled to the source region of power transistor 16 and serves as a place to bond wire 16 (shown in FIG. 1). Likewise, bond pad 18 serves as a place to bond gate wire 13. Bond pad 18, however, is not coupled directly to the gate region of MOSFET 16. Bond pad 18 is coupled to contact pad 12a, and source pad 19 is coupled to contact pad 12c. The gate of MOSFET 16 is coupled to another contact pad 12b. Contact pads 12a–c serve as bonding points for control chip 21, as will be seen.

Referring now to control chip 21 in FIG. 2, contact bumps 22a–c are formed on control chip 21 corresponding to contact pads 12a–c on power chip 11. Contact bumps 22a–c preferably comprise a metal coated with a solderable material, and should have a low thermal resistance. Gold coated with a tin or gold-tin alloy are suitable materials for contact bumps 22a–c. For ease of description the circuits shown in control chip 21 will be described, followed by the function of each of the contact bumps 22a–c.

Contact bump 22a is coupled to contact pad 12a, and thus gate wire 13. Gate wire 13 carries an external control signal to the thermally limited switch of the present invention, and serves as a supply voltage for control chip 22. Temperature dependent current reference 34 is powered by current received from contact bump 22a, and generates a current which is proportional to the temperature of control chip 21. Many such temperature dependent current sources are known, one common arrangement being known as a "deltaphi phi-over-R"

$$\left(\frac{\Delta\Phi}{R}\right) \text{circuit.}$$

This circuit is named because output current is a function of the difference between baseemitter diode drops of two transistors ($\Delta\phi$) established by the difference in the areas of the two transistors, and that $\Delta\phi$ is dropped across a resistance (R). It should be understood, though, that any current reference circuit can be used for current reference 34 as long as the current output is sensitive to the temperature of control chip 21.

Temperature dependent current reference 34 is coupled to temperature sense circuitry 35. As the temperature of chip 21 rises, a reference current generated by current reference 34 increases. Temperature sense circuitry serves to amplify the temperature sensitive current generated by current reference 34, and to output a first temperature sense signal to shut down circuitry 57. Shut down circuitry 57 is coupled across the gate and source of power MOSFET 16 so that as the temperature of chip 21 rises, a threshold temperature will be reached where shut down circuit 57 shunts voltage from contact bump 22b and the gate of MOSFET 16 thereby turning off MOSFET 16. Details of shut off circuit 57 will be discussed in greater detail hereinafter.

In addition to temperature sense circuit 35, current reference 34 is coupled to $\Delta T$ circuit 31 which generates a second temperature sense signal which is proportional to the difference in temperature between contact bump 22c and temperature sense circuit 35. The second temperature sense signal is coupled to shut down circuit 57 in a similar manner to the first temperature sense signal. As will be seen, contact bump 22c provides thermal information to ΔT sense circuit 31 very rapidly, and the second temperature sense signal is generated before temperature sense circuit 35 has time to respond. Thus, the second temperature sense signal reflects a transient thermal condition of power chip 11

Figure 3:
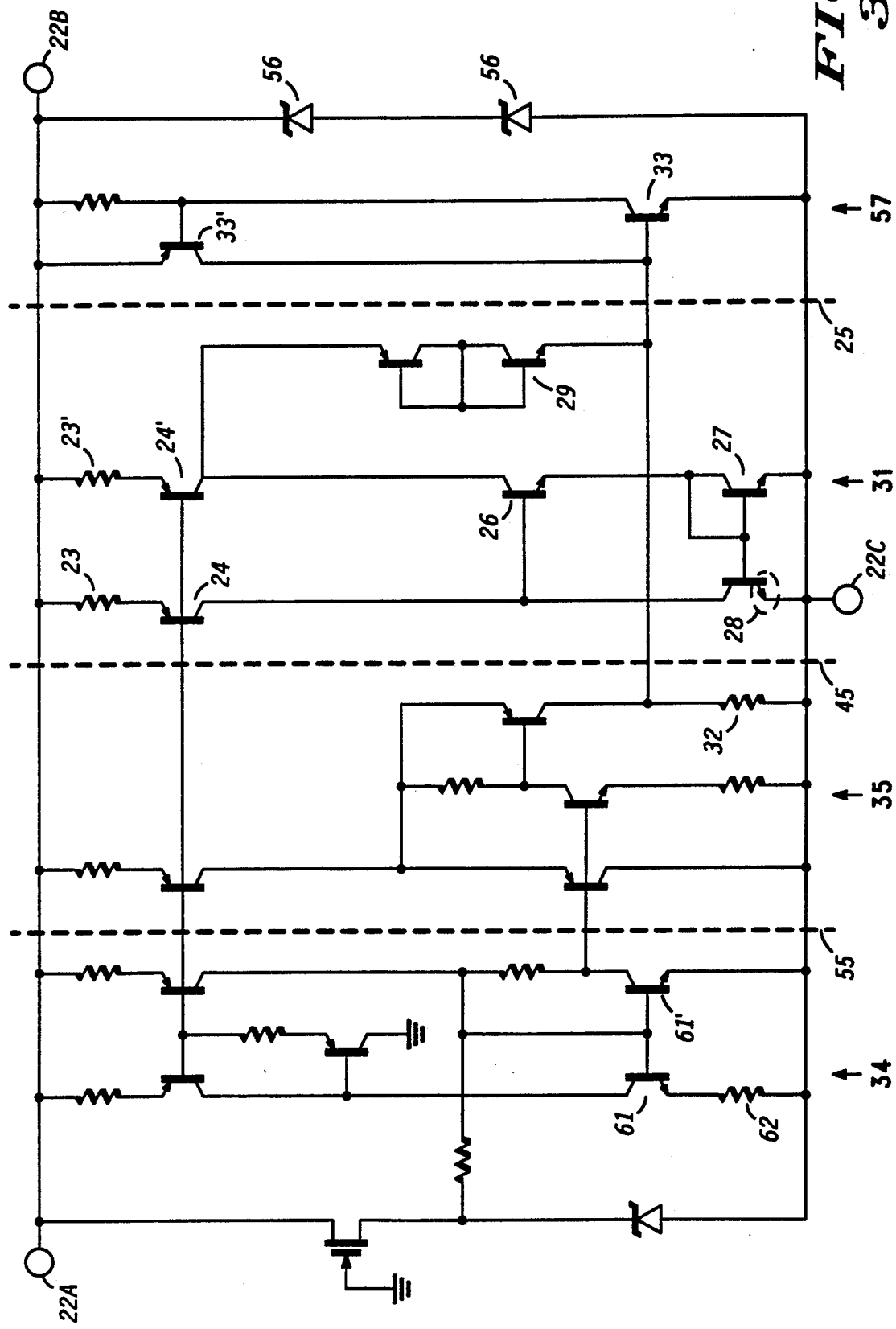
FIG. 3 shows a circuit diagram of temperature sense and control circuitry for the thermally limited switch.

FIG. 3 illustrates circuits 31,34,35, and 57 in greater detail. Temperature dependent current reference 34, shown to the left of dashed line 55, comprises the $$\left(\frac{\Delta \Phi}{R}\right) \text{circuit.}$$

A ratio of emitter area of transistor 61 to that of transistor 61' determines ΔΦ, and R is the value of resistor 62. Conveniently, temperature dependent current reference 34 is designed to generate a room temperature current of approximately 100 microamps using well know circuit design techniques. Size and parametric values of other resistors and transistors shown in current reference 34 must be compatible with the 100 microamp reference current, and are well-known in the art. As the temperature of chip 21 rises, the reference current will increase. Current reference 34 is coupled to temperature sense circuit 35 which essentially serves to amplify the temperature sensitive portion of the reference current, and generate the first temperature sense signal.

The first temperature sense signal is coupled to the gate of a silicon controlled rectifier (SCR) formed by transistors 33 and 33' which are part of shut down circuit 57. Zener diodes 56 are coupled across the gate-source of power MOSFET 16, and serve to protect the gate of MOSFET 16 from excess voltage. Diffused resistor 32 which is coupled to the SCR, determines a threshold current of the first temperature sense signal which must be reached before the SCR triggers. When the SCR triggers, voltage on contact bump 22b is shunted from the gate of MOSFET 16 shown in FIG. 2, and MOSFET 16 turns off. Once the threshold current is reached, the SCR will latch on, maintaining MOSFET 16 in an off state until the input signal on contact bump 22a is removed. Although shut down circuit 57 is illustrated as a latching switch, circuit designs are known which would allow for linear shut down, or non-latching shut down.

The ΔT circuitry 31 between dashed lines 25 and 45 in FIG. 3 serves to improve the sensitivity and decrease the response time required for thermal control chip 21 to shut down power MOSFET 16. Temperature dependent current reference 34 is also coupled to the bases of a pair of PNP transistors 24 and 24'. Transistors 24 and 24' are current sources for two legs of ΔT circuit 31, each having emitters coupled to contact bump 22a through resistors 23 and 23' respectively. Current flowing through transistors 24 and 24' is determined by the potential of the bases of transistors 24 and 24' and the value of resistors 23 and 23'. Resistors 23 and 23' can be trimmed to adjust the current in each leg of the current mirror, and the current is conveniently set at 100 microamps to match that of current reference 34. It should be understood, however, that current through αT circuit 31 may be significantly higher or lower than the reference current to add additional weight to the ΔT information.

Transistors 26, 28, and diode connected transistor 27 form what is commonly known as a Wilson mirror. The Wilson mirror is able to maintain a constant current in each of the legs of the current mirror even when there is a large variability in current gain of the transistors which comprise the Wilson current mirror. Other current mirrors can be used, but the added accuracy of the Wilson current mirror is preferable. Contact bump 22c is formed directly over a base-emitter junction of transistor 28 in the Wilson current mirror. Contact bump 22c is coupled to contact pad 12c, which is in turn coupled to source 19. Source 19 is usually coupled directly to ground.

Before bonding control chip 21 to power transistor chip 11, resistors 23 and 23' can be trimmed in order to optimize performance. Transfer diodes 29 comprise two diode coupled transistors, and are useful for isolating shut down circuit 57 from ΔT circuit 31 if resistors 23 and 23' are to be trimmed. Trimmable resistors 23 and 23' are trimmed so that the current flow in each leg of the current mirror is matched, and so that no current leaves the current mirror through transfer diodes 29 while protection chip 21 is at a steady state temperature. Trimming procedures are wellknown and a variety of resistor trimming techniques may be used.

In operation, temperature dependent current reference 34 and temperature sense circuit 35 function as described hereinbefore to provide a shut off current to SCR 33/33' when control chip 21 temperature reaches a predetermined threshold. In addition to this thermal shut down, contact bump 22c, which is coupled directly to the source of power MOSFET 16, serves to couple transient thermal information from the surface of power switching chip 11 to control chip 21.

Contact bump 22c will typically be 10-25 microns thick, so thermal information is coupled very quickly from the surface of power switching chip 11 to control chip 21. As heat is conducted to control chip 21, the emitter base junction of transistor 28 heats almost instantaneously, well before the thermal mass of protection chip 21 has heated. In fact, the base-emitter junction of transistor 28 will often heat faster than the bulk of power transistor chip 11. As transistor 28 heats up, more current flows through transistor 28, causing the right leg of ΔT circuit 31 to shut off. Essentially, transistor 26 turns off while transistors 28 and 26 are at different temperatures. When transistor 26 shuts off, current in the right leg of ΔT circuit 31 is transferred via transfer diode 29 to the gate of the SCR formed by transistors 33 and 33'. This current adds to any current which is already being generated by temperature sense circuit 35. Resistor 32 and the SCR function as described hereinbefore to turn off the gate of MOSFET 16.

Since the additional signal provided through transfer diode 29 is sensitive not only to temperature but also to the difference in temperature between transistor 28 and other transistors on the chip, it is called a ΔT circuit. Output from the ΔT circuit sums with output from the temperature sensitive circuit, and the combined signal is used to turn on shunting transistor 33.

Figure 4:
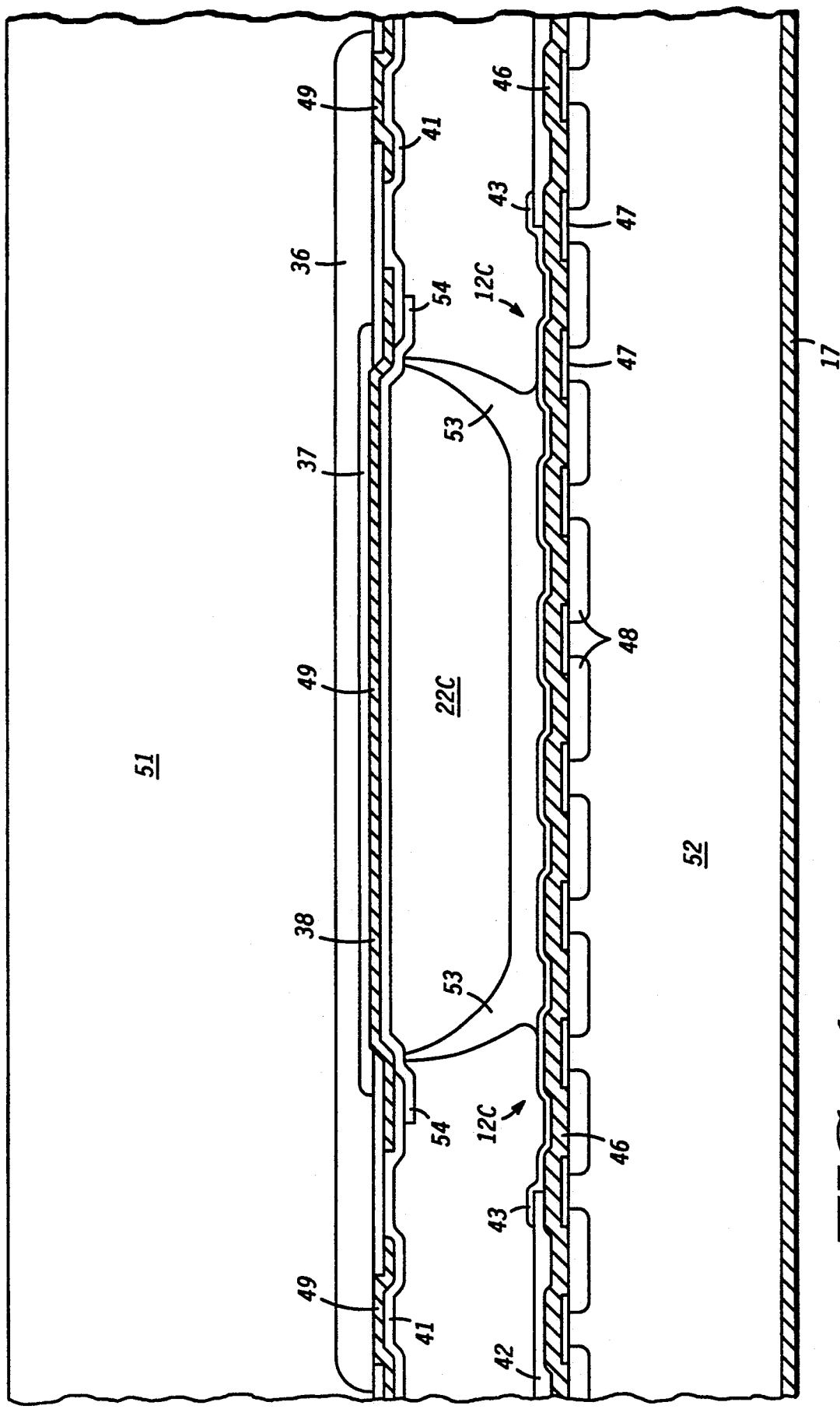
FIG. 4 shows a highly magnified cross sectional view of a metallic bump contact which serves as a temperature sensor for the thermally limited switch.

FIG. 4 illustrates a cross section of contact bump 22c and contact pad 12c. Control chip 21 and power switching chip 11 are preferably formed of similar substrates 51 and 52 which comprise a material such silicon. It is desirable for substrates 51 and 52 to be similar so that thermal coefficient of expansion of each of the substrates is the same, greatly reducing mechanical stress on the interface between the chips.

Power switching chip 11 is illustrated as a power MOSFET. Power switching transistor 11 comprises diffused regions 48 and gate regions 47, wherein the gate regions control current flow from source metal 46 to drain metal 17. Source metal 46 forms the source electrode of power MOSFET 16 shown in FIG. 2, and comprises a metal such as aluminum. Passivation oxide 42 is conventionally formed over source metal 46 and patterned to expose areas where contact pad 12c will be formed. Source metal 46 is coated with a barrier multi-layer 43 comprising a material such as titanium-tungsten, titanium nitride, or the like and a layer of solderable material such as gold. Barrier multi-layer 43 serves to separate source metal 46 from gold in contact bump 2c, and to provide a solderable surface coating when aluminum is used for source metal 46.

Heat which is generated by current flowing through switching transistor 11 is generated primarily at the top surface of substrate 52 in diffused regions 48. Thus, it can be seen that contact pad 12c is formed within a few microns of the actual generation point of heat in switching transistor 11. Transient thermal conditions will occur first at the surface of substrate 52 in diffused regions 48, and any damage that occurs to the chip due to transient thermal conditions will occur at this surface.

It is important that the solderable metal which coats multi-layer 43 has a low thermal impedance, which is why gold is a preferable material. Solderable metals such as lead have relatively high thermal impedances and will cause a longer delay in transferring heat from the surface of power switching chip 11 to the top of contact pad 12c. Contact bump 22c is coupled directly to contact pad 12c. Contact bump 22c is also formed of a highly thermally conductive material, and is coated with a solder layer 53, so that contact bump 22c and contact pad 12c can be joined by thermal eutectic formation. Solder layer 53 preferably comprises tin, or a gold-tin alloy.

Emitter 37 and base 36 of transistor 28 are formed in the top surface of substrate 51. Transistor 28 is passivated, usually with an oxide or silicon nitride 41 similar to that used in power switching transistor 11. A front metal 38, comprising a metal such as aluminum, is formed in contact with emitter 37. Barrier multi-layer 54 which is similar to barrier multi-layer 43, separates gold in contact bump 22c from front metal 38 when aluminum is used for front metal 38. Contact bump 22c is formed using techniques well-known in the art and extends beyond the top surface of front metal 38 by approximately 10-25 microns. Contact bump 22c is preferably about 3 mils in diameter, and as described hereinbefore, contact bump 22c comprises the material with a low thermal resistance.

It can be seen that emitter 37 is coupled to the top surface of power switching transistor 11 to form a low thermal impedance metal contact. In addition to its low thermal impedance, contact bump 22c is relatively thin so total thermal impedance between the top surface of power switching transistor 11 and emitter 37 is very small. Solder layer 53 is very thin, and adds little thermal impedance between contact pad 12c and contact bump 22c.

Steady state heat generated by power switching transistor 11 is passed through contact bump 22c to heat the entire control chip 21. If a transient thermal condition exists in power chip 11, such as when the output is shorted and a large amount current flows through power transistor 11, the transient thermal information will be coupled immediately to emitter 37, activating the $\Delta T$ circuitry to shunting voltage from gates 47 of MOSFET 16 thus turning off the power switching transistor.

By now, it should be apparent that a thermally protected power switch has been provided with the greatly improved thermal shut off speed. In addition to sensing temperature on a separate chip, transient thermal conditions are sensed, and the control chip can shut off the power switching transistor based on this transient thermal information. Because the control chip is fabricated separately from the power switching transistor, processing does not have to be compatible between the two chips, thus greatly reducing the manufacturing cost for the thermally protected switch. The control chip is located remarkably close to the hot surface of the power switching transistor and circuitry on the control chip is designed to react to transient thermal conditions, not only steady state temperature. Thus, thermal response time is greatly improved affording greater protection of the power switching transistor.

I claim:
1. A thermally protected switch comprising:
a first chip having the switch formed thereon and having an electrode wherein the switch is on when a control signal is present on the electrode; and a second chip having control circuitry formed on a top side, the control circuitry further comprising a temperature sensitive portion, a means for shunting the control signal from the electrode when the temperature sensitive portion is a predetermined temperature, and a means for thermally coupling the first chip to the temperature sensitive portion of the control circuitry, wherein the means for thermally coupling is located over a primary heat generation point of the first chip and the second chip is mounted on the first chip so that active areas of the two chips face each other.

2. The switch of claim 1 wherein the means for thermally coupling the first chip to the portion of the control circuitry is a metal bump formed on the top side of the second chip.

3. The switch of claim 1 wherein the control signal is an external control signal which is coupled to the electrode, and the second chip is powered by current received from the first chip through the electrode and returned to the first chip by the means for thermally coupling.

4. The switch of claim 1 wherein the means for thermally coupling also electrically couples the first chip to the temperature sensitive portion of the control circuitry.

5. The switch of claim 1 wherein the first chip is a power transistor and the temperature sensitive portion of the control circuitry comprises a bipolar transistor.

6. A semiconductor device having two semiconductor chips each having active devices formed thereon, the device comprising a single means for thermally and electrically coupling the two chips, wherein one of the chips further comprises a means for generating a first signal proportional to the temperature of the other chips;
a means for generating a second signal proportional to the difference in temperature between the two chips; and a means for adding the first and second signals.

7. The semiconductor device of claim 6 wherein the means for adding the first and second signals on one of the chips is coupled to the other chip by the single means for thermally and electrically coupling the two chips.

8. A temperature control circuit for a power semiconductor switch comprising: a means for thermally coupling the power semiconductor switch and the temperature control circuit; a first temperature sensitive portion spaced away from the means for thermally coupling which generates a first signal which is proportional to the temperature of the control circuit; a second temperature sensitive portion which contacts the means for thermally coupling and generates a second signal which is a function of the first signal and the difference in temperature between the first and second temperature sensitive portions; a means for generating a third signal which is a sum of first and second signals; and a means for turning off the power switch which is controlled by the third signal.

9. The circuit of claim 8 wherein the temperature control circuit is formed on a first chip and the power semiconductor switch is formed on a second chip.

10. The circuit of claim 8 further comprising: a means for sensing the current flowing in the semiconductor switch; a means for generating a fourth signal which is a function of the current flowing in the semiconductor switch, wherein the means for turning off the power switch is controlled by the sum of the third and fourth signals.

11. The circuit of claim 8 wherein the power switch is turned on by an external control signal which is coupled to the switch, and the control circuit is powered by power received from the external control signal.

* * * * *